(12) United States Patent
Tanaka

(10) Patent No.: US 7,532,509 B2
(45) Date of Patent: May 12, 2009

(54) SEGMENTED BIT LINE FOR FLASH MEMORY

(75) Inventor: Tomoharu Tanaka, Yokohama (JP)

(73) Assignee: Intel Corporation, Santa Clara, CA (US)

( * ) Notice: Subject to any disclaimer, the term of this patent is extended or adjusted under 35 U.S.C. 154(b) by 166 days.

(21) Appl. No.: 11/772,115

(22) Filed: Jun. 30, 2007

(65) Prior Publication Data

US 2009/0003059 A1    Jan. 1, 2009

(51) Int. Cl.
*G11C 11/34* (2006.01)
(52) U.S. Cl. .................. 365/185.05; 365/185.11
(58) Field of Classification Search ............ 365/185.05, 365/185.11, 185.12
See application file for complete search history.

(56) References Cited

U.S. PATENT DOCUMENTS

| 5,424,997 | A  * | 6/1995 | Rapp ..................... 365/238.5 |
| 6,621,733 | B2 * | 9/2003 | Chiu .................... 365/185.06 |
| 6,768,663 | B2 * | 7/2004 | Ogata ......................... 365/63 |
| 7,042,765 | B2 * | 5/2006 | Sibigtroth et al. ...... 365/185.13 |

* cited by examiner

*Primary Examiner*—Anh Phung
(74) *Attorney, Agent, or Firm*—Cool Patent, P.C.

(57) ABSTRACT

A memory device including segmented bit lines with memory cells coupled to a data cache is provided. A segmented bit line includes a bias transistor to selectively connect the bit line to a source line. Further, a physical implementation showing a segmentation pattern of the memory device is also provided.

15 Claims, 4 Drawing Sheets

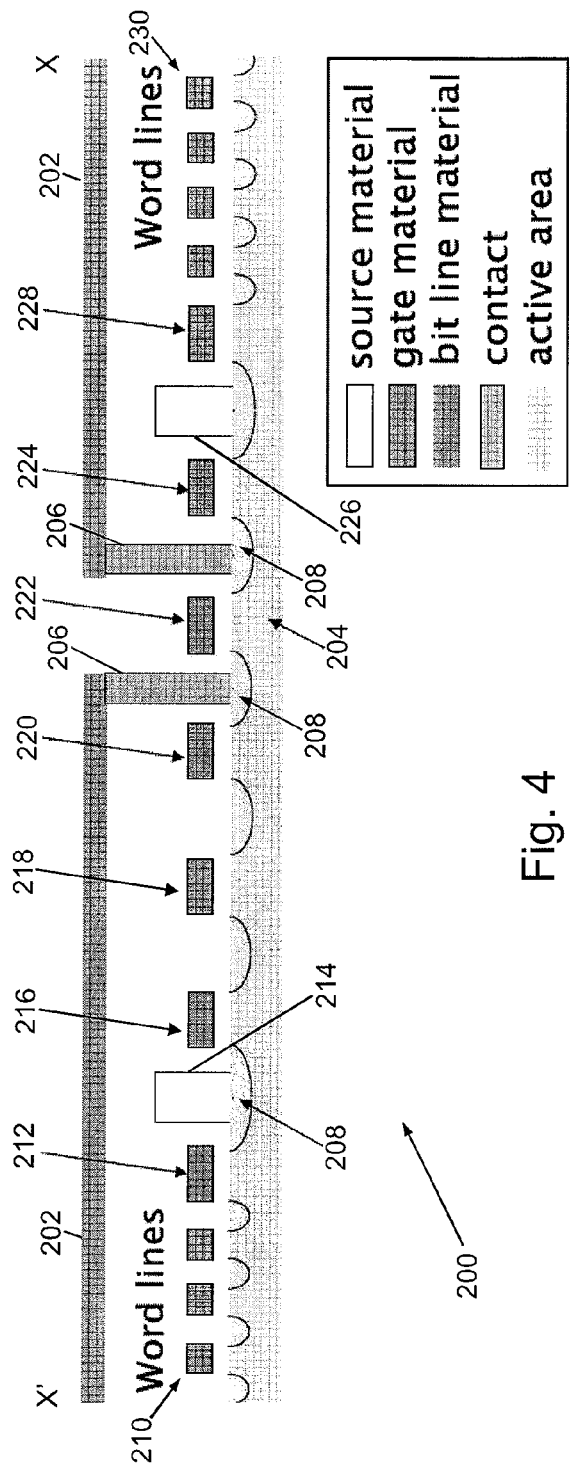
Fig. 4
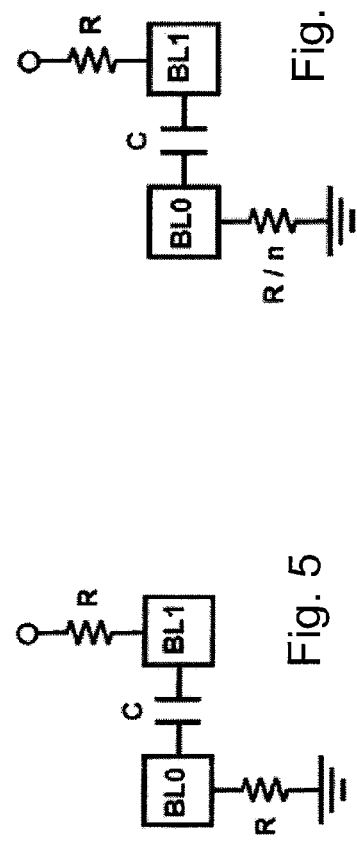
Fig. 5
Fig. 6

SEGMENTED BIT LINE FOR FLASH MEMORY

BACKGROUND

Numerous desirable features of flash memory, such as low-cost, high-density, high-speed architecture, low power, and high reliability, have made flash memory a popular choice for storing data, particularly for battery-powered devices. As such, flash memory devices have been diminishing in size and/or increasing in density for more versatile applications. For example, multiple memory cells in series such as NAND flash memory may be used to increase memory capacity.

As NAND flash design rule is scaled down, and as more memory capacity is required, the bit line width becomes narrower and longer. In addition, there is less space separating bit lines. These conditions may cause the parasitic capacitance and resistance to increase, which in turn, causes data throughput to decrease.

BRIEF DESCRIPTION OF THE DRAWINGS

The invention will be understood more fully from the detailed description given below and from the accompanying drawings of embodiments of the invention which, however, should not be taken to limit the invention to the specific embodiment(s) described, but are for explanation and understanding only.

FIG. 4 is a cross-sectional view of the physical representation of FIG. 3, taken along X'-X.

FIGS. 5-6 are schematic diagrams illustrating parasitic resistance and capacitance.

DETAILED DESCRIPTION

Figure 1:
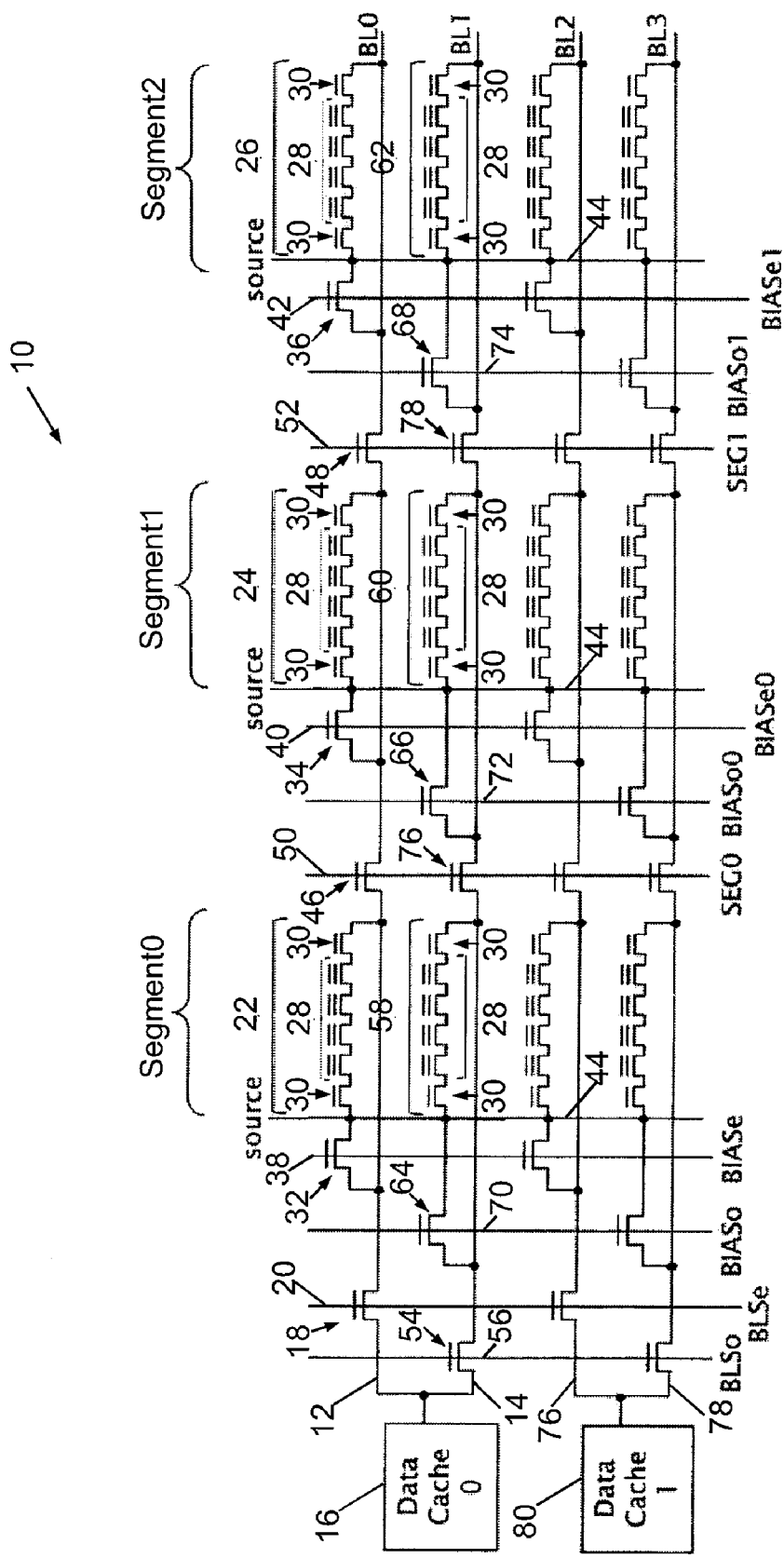
FIG. 1 is a circuit diagram according to one embodiment of the present invention.

Referring to FIG. 1, a circuit diagram 10 of a memory device is shown in accordance with one embodiment of the present invention. Referring specifically to the top half of the illustration, bit lines 12 and 14 are connected to a data cache 16 ("Data Cache 0"). Bit line 12 ("BL0") is referred to as an even bit line, while bit line 14 ("BL1") is referred to as an odd bit line. Particularly, bit line 12 includes a selection transistor 18 capable of receiving a signal 20 ("BLSe" or "SEG"). The signal 20 to selection transistor 18 determines whether bit line 12 is selected. Selection of bit line 12 may be determined by a controller (not shown), which sends signal 20 to the selection transistor 18 to turn it on or off. Typically, when the selection transistor 18 is turned on, the first bit line 12 is selected.

In one embodiment, bit line 12 is divided into segmented bit lines 22, 24 and 26, also referred to as "segments" or "bit line segments". In general within the circuit, the first few segmented bit lines may be referred to as "Segment0", "Segment1", and "Segment2". Each segment 22, 24, 26 includes a plurality of memory cells 28 in a "string", and select gate transistors 30 connected to both ends of the string.

As shown, the memory cells are floating gate transistors and are laid out in series such as in a NAND memory configuration. Each memory cell includes a word line coupling a control gate of the memory cell to a row decoder or controller (not shown), and a bit line coupled to a drain of the memory cell. As is generally known, word lines and bit lines are useful to determine the location and content of the memory cells.

Each segment 22, 24, 26 further includes a bias transistor 32, 34, 36, respectively. Bias transistor 32 may receive a signal 38 ("BIASe") provided by a controller (not shown). Similarly, bias transistor 34 may receive a signal 40 ("BIASe0") and bias transistor 36 may receive a signal 42 ("BIASe1"), both signals provided by the controller.

When the controller instructs any of the bias transistors to turn on, the bit line becomes connected to a source line 44. In one embodiment, the source line is connected to ground. In another embodiment, the source line is connected to 0 voltage, or a very low voltage. More details are provided in FIG. 2 below.

Preceding bias transistor 34, 36 is a segmentation transistor 46, 48 that receives and/or sends a signal 50 ("SEG0"), 52 ("SEG1"), respectively. The signal 50, 52 may be a segment indicator, a signal similar to the one received by selection transistor 18 to determine transistor state, and/or a signal to determine whether a corresponding segmented bit line is active or selected. The segmentation transistors separate the segmented bit lines.

The circuitry of bit line 14 is similar to the circuitry of bit line 12, and differs in receiving different signals and/or receiving signals from different controllers. The differences will be more apparent after the description of FIG. 2. Bit line 14 includes a selection transistor 54 capable of receiving a signal 56 ("BLSo" or "SEG") to turn the transistor on for selecting bit line 14. Bit line 14 further includes segmented bit lines 58, 60, 62 including memory cells 28 and select gate transistors 30. Each segmented bit line 58, 60, 62 is coupled to a bias transistor 64, 66, 68 receiving a signal 70 ("BIASo"), 72 ("BIASo0"), 74 ("BIASo1"), all respectively. Segment 60, 62 is coupled to a segmentation transistor 76, 78 preceding an adjacent bias transistor 66, 68, respectively.

Referring to bit lines 12 and 14 in one embodiment, the selection transistors and the bias transistors are identical to the select gate transistors 30. In another embodiment, the selection transistors and/or the bias transistors may be different.

In one embodiment, in both bit lines 12 and 14, not every segmented bit line includes a bias transistor for connecting to the source line. It may be sufficient to ground the bit line using a bias transistor in some segments but not others.

It is appreciated that bit line 14 may include a circuit implementation that is different from bit line 12. There may be circuit requirements, for example, such as maintaining the memory cells of the bit lines in row alignment with bit line 12 for word line selection.

It is noteworthy that bit lines 12 and 14 may be long and include a large number of memory cells with additional segmented bit lines. Although four memory cells are pictured in each segmented bit line in the figure, the number of memory cells may be lower or higher. In the embodiment shown on the circuit diagram, the bit lines are segmented to include the same number of memory cells. In another embodiment, the bit lines need not be split evenly with the same number of memory cells in each segment. Further, although pictured with NAND memory cells, the scope of the invention may encompass applications with other types of non-volatile memory cells and with other memory array architectures.

It is also noted that one or more controllers may turn on and off any or all of the transistors as needed to select the desired bit line, segment, or memory cells. In addition, the figure does not indicate all of the possible connections from various components to the controllers.

Referring now to the lower half of the circuit diagram 10, additional bit lines 76 ("BL2") and 78 ("BL3") are coupled to a data cache 80 ("Data Cache 1"). In one embodiment, bit lines 76 and 78 are structurally and functionally identical to bit lines 12 and 14, respectively. Bit line 76 is an even bit line and bit line 78 is an odd bit line. However, it is noted that the bit lines are not required to be identically structured.

The data caches 16 and 78 may include sense amplifiers for current sensing in reading the memory cells. Data cache may further include circuitry to program and erase the memory cells.

In one embodiment, additional data caches and bit lines are arranged in an identical or substantially similar memory cell array as part of the memory device. In configuring the memory cell array in such a way, for example, by aligning rows of word lines and aligning columns of bit lines, space utilization may be maximized. In an exemplary implementation, the memory device includes additional bit lines and word lines such as shown and described below in the segmentation pattern of FIG. 3.

Figure 2:
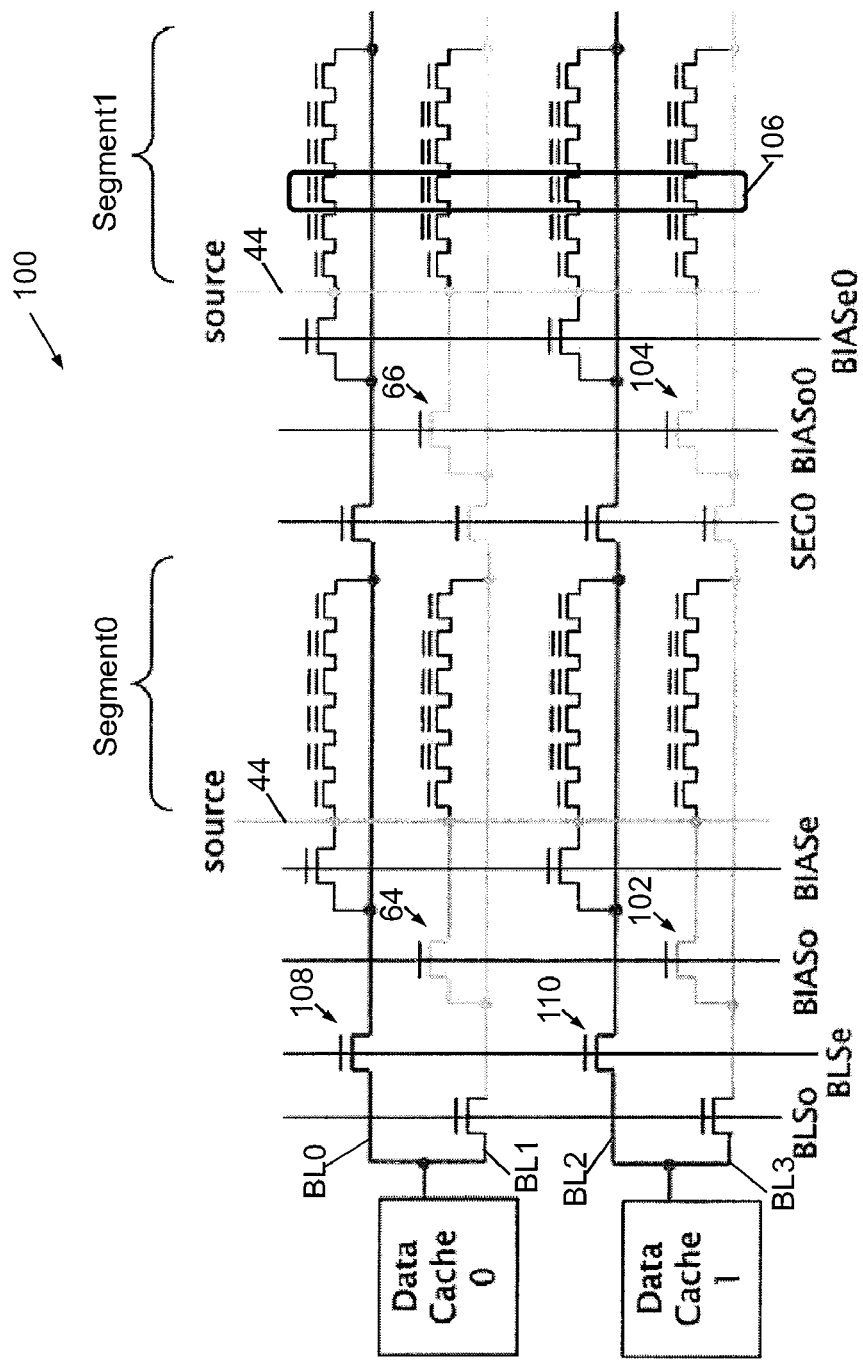
FIG. 2 is a circuit diagram illustrating what occurs when even bit lines are selected according to one embodiment.

Turning to FIG. 2, according to one embodiment, a circuit diagram illustrating what occurs when even bit lines 12 and 76 are selected is shown at 100. The circuit diagram 100 zooms in on FIG. 1, showing alternating even BL0 (12), BL2 (76) and odd bit lines BL1 (14), BL3 (78), the first and second bit line segments Segment0 and Segment1, and other transistors.

As an example, a controller selects a row 106 of word lines from Segment1 to obtain data from the corresponding memory cells. When the even bit lines are selected for a read operation, for example, by a signal BLSe indicating selection of BL0 and BL2 at selection transistors 108 and 110, respectively, the odd bit lines BL1 and BL3 are not carrying data and need to be tied to a source line 44 or grounded for the read operation. Typically for each bit line, this is performed by grounding a bias transistor located in the vicinity of the data cache such as, for example, bias transistor 64 or 102. However, when the bit line is long due to lengthy memory cell strings, grounding of the bit lines further down from the data cache is ineffective. Therefore, data throughput in the memory device is decreased due to the increased potential of parasitic resistance and capacitance.

In accordance with one embodiment, the bit lines have been divided into segmented bit lines Segment0 and Segment1. Instead of grounding one bias transistor 64, 102 for a lengthy bit line, the odd bit line may be selectively grounded at each segment of the segmented bit line. Thus, bias transistor 66, 104 may receive a "BIASo", "BIASo0" signal to connect the segmented bit line to the source line 44. It should be noted that although not shown, this grounding continues further down the bit line where additional bias transistors may be selectively turned on or off for connecting the segments to a source line.

In one embodiment, when a bit line (regardless of whether it is an even or odd) is not selected as determined by the selection transistor 108, 110, all of the bias transistors on the same bit line are tied to the source line for grounding. In another embodiment, selected bias transistors are grounded, while others not selected are not grounded.

Figure 3:
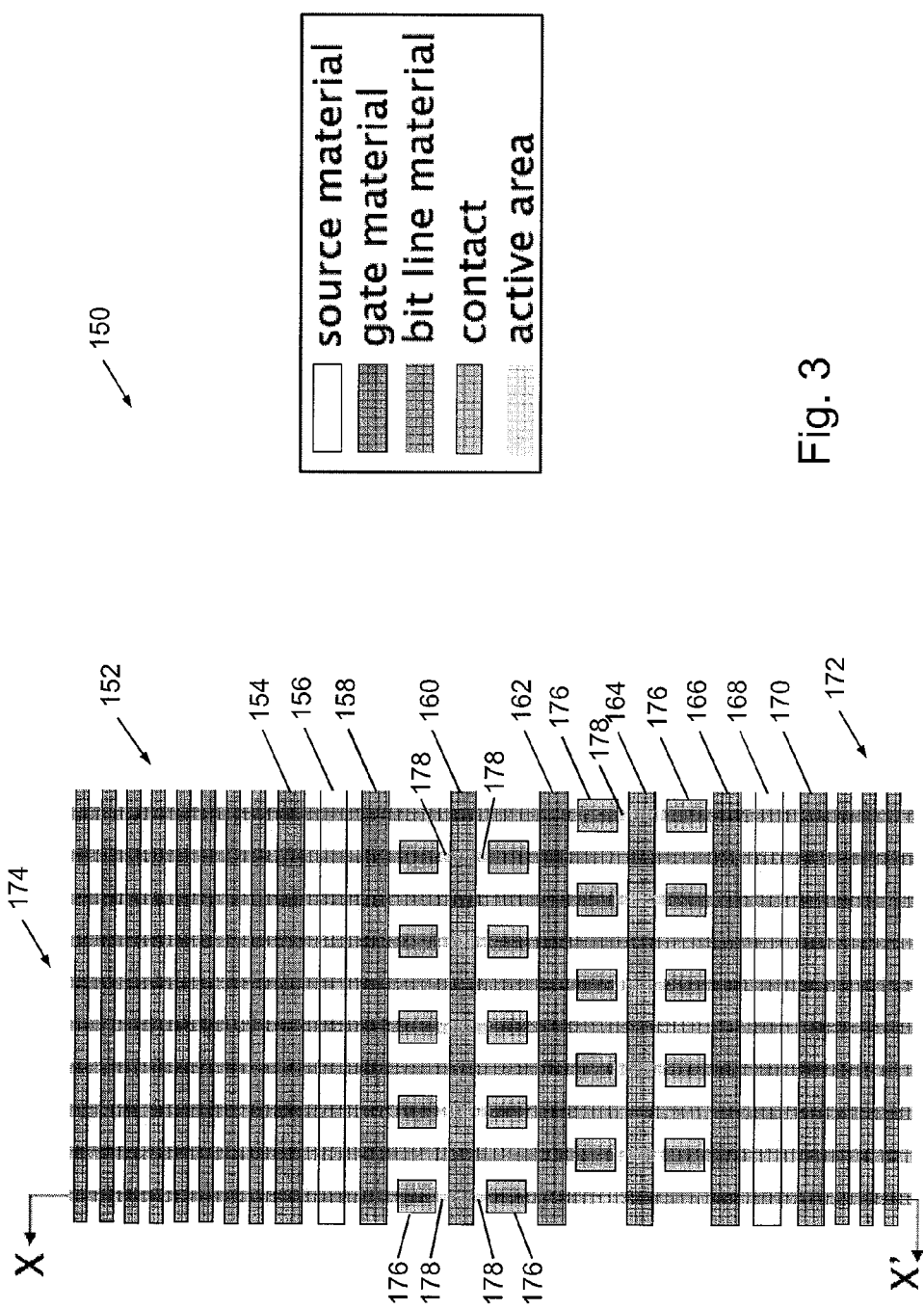
FIG. 3 is a physical representation of a semiconductor implementation according to one embodiment.

Referring to FIG. 3, in a physical implementation of the circuit diagram of the memory device in FIGS. 1 and 2 above, and in accordance with one embodiment of the present invention, a segmentation pattern is shown at 150. The segmentation pattern shows rows of word lines 152, select gate line 154, source line 156, "BIASe" signal line 158, "SEG" signal line 160, bias voltage line 162, "SEG" signal line 164, "BIASo" signal line 166, source line 168, select gate line 170, and word lines 172. Bit lines 174 are shown as columns in the figure. The segmentation pattern 150 further illustrates contacts 176 and active areas 178, as further shown and described in FIG. 4 below. The illustration of FIG. 3 only shows a portion of an equivalent circuit of the memory device.

Turning to FIG. 4, a cross-sectional view of the exemplary semiconductor segmentation pattern of FIG. 3 is provided at 200, the cross-section taken along line X'-X. A bit line 202 is coupled to the active area 204 via a contact 206. The active area 204 is a p-substrate and the contact 206 is positioned on an n+ diffusion layer 208 on top of the p-substrate.

From left to right, the cross-sectional view further includes word lines 210, select gate line 212, source line 214, "BIASo" signal line 216, "SEG" signal line 218, bias voltage line 220, "SEG" signal line 222, "BIASe" signal line 224, source line 226, select gate line 228, and word lines 230. The source line 214, 226 is typically coupled to a metal or other highly conductive material to provide a low-resistance line to ground. An atub voltage is applied to the bias voltage line 220 and provides proper biasing to the substrate of memory cells as may be required during a read, erase, or write operation.

Referring to FIG. 5, in a conventional memory device with a large number of memory cells, the time delay may be determined using this representation. Without segmentation of the bit line, the time delay constant is 2 times RC, where R is the circuit resistance and C is the circuit capacitance of the conventional memory device.

Now referring to FIG. 6, a memory device with a large number of memory cells in accordance with one embodiment of the present invention is represented as shown. In the case where a bit line is segmented into "n" number of segments the time delay constant is a minimum of $1/n^2$ times RC, and a maximum of $(1+1/n)/2$ times RC, where R is the circuit resistance and C is the circuit capacitance of the memory device. As the number of segmentations increases, the parasitic capacitance and resistance decreases.

It is appreciated that the invention has been explained with reference to one exemplary embodiment, and that the invention is not limited to the specific details given above. References in the specification made to other embodiments fall into the scope of the present invention.

Any reference to device may include a component, circuit, module, or any such mechanism in which the device can achieve the purpose or description as indicated by the modifier preceding the device. However, the component, circuit, module, or any such mechanism is not necessarily a specific limitation to the device.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the invention. The various appearances of "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Those skilled in the art having the benefit of this disclosure will appreciate that many other variations from the foregoing description and drawings may be made within the scope of the present invention. Indeed, the invention is not limited to the details described above. Rather, it is the following claims including any amendments thereto that define the scope of the invention.

What is claimed is:

1. A memory device comprising:
   a first bit line coupled to a first plurality of memory cells;
   a second bit line coupled to a second plurality of memory cells;
   a source line coupled to the first and second pluralities of memory cells;
   a data cache capable of reading data from the first and second pluralities of memory cells;
   a selection transistor capable of selecting the first bit line and connecting the first bit line to the data cache; and
   a plurality of bias transistors coupled to the second bit line, one or more of the plurality of bias transistors capable of connecting the second bit line to the source line,
   wherein the second bit line is arranged in second bit line segments, one or more of the second bit line segments comprising a portion of the second plurality of memory cells and coupled to said one or more of the plurality of bias transistors.

2. The memory device of claim 1 wherein when the first bit line is selected and connected to the data cache, said one or more of the plurality of bias transistors connect said one or more of the second bit line segments to the source line.

3. The memory device of claim 1 further comprising a plurality of bias transistors coupled to the first bit line, one or more of the plurality of bias transistors capable of connecting the first bit line to the source line.

4. The memory device of claim 3 wherein the first bit line is arranged in first bit line segments, one or more of the first bit line segments comprising a portion of the first plurality of memory cells, and one of said plurality of bias transistors coupled to the first bit line.

5. The memory device of claim 4 wherein when the second bit line is selected and connected to the data cache, said one or more of the plurality of bias transistors coupled to the first bit line connects said one or more of the first bit line segments to the source line.

6. The memory device of claim 1 wherein the source line is connected to ground.

7. The memory device of claim 1 wherein the memory cells are NAND memory cells.

8. The memory device of claim 1 wherein the selection transistors are structurally the same as the select gate transistors.

9. The memory device of claim 1 wherein the bias transistors are structurally the same as the select gate transistors.

10. The memory device of claim 1 wherein the second bit line segments contain the same number of memory cells.

11. The memory device of claim 1 wherein at least one of the second bit line segments contains a different number of memory cells.

12. A memory device comprising:
   a data cache capable of reading memory cells;
   a first bit line coupled to the data cache and a plurality of memory cells divided into first segmented bit lines, the first segmented bit lines selectively connectable to a source line;
   a first selection transistor capable of connecting the first bit line to the data cache;
   first bias transistors coupled to the first segmented bit lines and capable of connecting the first segmented bit lines to the source line;
   a second bit line coupled to the data cache and a plurality of memory cells divided into second segmented bit lines;
   a second selection transistor capable of connecting the second bit line to the data cache; and
   second bias transistors coupled to the second segmented bit lines and capable of connecting the second segmented bit lines to the source line;
   wherein when the first selection transistor is selected to connect the first bit line to the data cache, the second bias transistors connect the second segmented bit lines to the source line.

13. The memory device of claim 12 wherein when the second selection transistor is selected to connect the second bit line to the data cache, the first bias transistors connect the first segmented bit lines to the source line.

14. The memory device of claim 12 wherein the source line is connected to ground.

15. The memory device of claim 12 further comprising segmentation transistors coupled to the first bit line to separate the first segmented bit lines.

* * * * *